United States Patent
Kai

(10) Patent No.: US 11,309,200 B2
(45) Date of Patent: Apr. 19, 2022

(54) SUBSTRATE STORAGE CONTAINER

(71) Applicant: Miraial Co., Ltd., Tokyo (JP)

(72) Inventor: Satoko Kai, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 81 days.

(21) Appl. No.: 16/488,528

(22) PCT Filed: Feb. 27, 2017

(86) PCT No.: PCT/JP2017/007473
§ 371 (c)(1),
(2) Date: Aug. 23, 2019

(87) PCT Pub. No.: WO2018/154779
PCT Pub. Date: Aug. 30, 2018

(65) Prior Publication Data
US 2020/0043755 A1    Feb. 6, 2020

(51) Int. Cl.
*H01L 21/673*    (2006.01)
(52) U.S. Cl.
CPC .... *H01L 21/6732* (2013.01); *H01L 21/67369* (2013.01); *H01L 21/67373* (2013.01); *H01L 21/67379* (2013.01); *H01L 21/67383* (2013.01)
(58) Field of Classification Search
CPC ... B65G 49/07; H01L 21/67; H01L 21/67309; H01L 21/67313; H01L 21/6732; H01L 21/67326; H01L 21/6734; H01L 21/67303; H01L 21/673; H01L 21/6735; H01L 21/67359; H01L 21/67369; H01L 21/67373; H01L 21/67379; H01L 21/67383; B65D 85/48
See application file for complete search history.

(56) References Cited

U.S. PATENT DOCUMENTS 4,566,839 A * 1/1986 Butler ............... H01L 21/67313
                                                        118/500
5,228,568 A * 7/1993 Ogino ............... H01L 21/67369
                                                        206/587
(Continued)

FOREIGN PATENT DOCUMENTS

EP    1724825 A1 * 11/2006    ....... H01L 21/67369
JP    2004-111830 A    4/2004
(Continued)

*Primary Examiner* — J. Gregory Pickett
*Assistant Examiner* — Abigail Elizabeth Guidry
(74) *Attorney, Agent, or Firm* — Muncy, Geissler, Olds & Lowe, P.C.

(57) ABSTRACT

A back side substrate support portion 6 includes a lower side inclined face 622 on which an end of a back face of a substrate W slides, and a substrate support portion 632 that is located above the lower side inclined face 622 and can support an edge portion of the substrate W. When a container main body opening portion 21 is closed by a lid body 3, the edge portion of the substrate W slides on the lower side inclined face 622 and reaches the substrate support portion 632. At least a portion of the lower side inclined face 622 is configured from a second member that is different from a first member that configures the substrate support portion 632, and the second member has a lower maximum static friction coefficient and lower wear resistance than the first member.

4 Claims, 11 Drawing Sheets

(56) References Cited

U.S. PATENT DOCUMENTS

| | | | | |
|---|---|---|---|---|
| 5,348,151 A * | 9/1994 | Dressen | ............... | B65D 25/107 |
| | | | | 118/500 |
| 5,575,394 A * | 11/1996 | Nyseth | .............. | H01L 21/67373 |
| | | | | 206/710 |
| 5,706,946 A * | 1/1998 | Kakizaki | .............. | B65D 25/107 |
| | | | | 206/454 |
| 5,960,960 A * | 10/1999 | Yamamoto | ........ | H01L 21/67326 |
| | | | | 206/454 |
| 6,036,031 A * | 3/2000 | Ishikawa | ............ | G11B 33/0444 |
| | | | | 118/500 |
| 6,110,285 A * | 8/2000 | Kitazawa | ................ | C30B 31/14 |
| | | | | 118/715 |
| 6,776,289 B1 * | 8/2004 | Nyseth | .............. | H01L 21/67383 |
| | | | | 206/454 |
| 7,344,031 B2 * | 3/2008 | Hasegawa | ......... | H01L 21/67369 |
| | | | | 206/710 |
| 7,726,490 B2 * | 6/2010 | Matsutori | ......... | H01L 21/67373 |
| | | | | 206/711 |
| 8,910,792 B2 * | 12/2014 | Nagashima | ....... | H01L 21/67383 |
| | | | | 206/711 |
| 9,633,877 B2 * | 4/2017 | Gregerson | ........ | H01L 21/67369 |
| 9,673,075 B2 * | 6/2017 | Gregerson | ........ | H01L 21/67376 |
| 10,559,484 B2 * | 2/2020 | Kato | ................ | H01L 21/67369 |
| 10,910,247 B2 * | 2/2021 | Honsho | ............ | H01L 21/67393 |
| 10,910,262 B2 * | 2/2021 | Kuroda | ............ | H01L 21/76849 |
| D920,935 S * | 6/2021 | Sambu | ........................ | D13/182 |
| 2005/0115865 A1 * | 6/2005 | Matsutori | ......... | H01L 21/67383 |
| | | | | 206/710 |
| 2005/0247594 A1 | 11/2005 | Mimura et al. | | |
| 2010/0307957 A1 * | 12/2010 | Wiseman | .......... | H01L 21/67369 |
| | | | | 206/711 |
| 2011/0064896 A1 | 3/2011 | Kudo et al. | | |
| 2011/0266193 A1 * | 11/2011 | Chiu | ................. | H01L 21/67383 |
| | | | | 206/711 |
| 2014/0367307 A1 * | 12/2014 | Oyama | ............. | H01L 21/67386 |
| | | | | 206/711 |
| 2015/0068948 A1 * | 3/2015 | Hong | ................ | H01L 21/67326 |
| | | | | 206/711 |
| 2021/0013073 A1 * | 1/2021 | Matsutori | ............... | G03F 7/708 |
| 2021/0043485 A1 * | 2/2021 | Saido | .................... | H01L 21/324 |
| 2021/0111048 A1 * | 4/2021 | Narita | ............... | H01L 21/67379 |
| 2021/0143027 A1 * | 5/2021 | Lee | .................... | H01L 21/67309 |
| 2021/0151338 A1 * | 5/2021 | Chandrasekaran | .......................... | |
| | | | | H01L 21/67736 |

FOREIGN PATENT DOCUMENTS

| | | | | | |
|---|---|---|---|---|---|
| JP | 2004111830 A | * | 4/2004 | | |
| JP | 2005191021 A | | 7/2005 | | |
| JP | 2005191021 A | * | 7/2005 | ....... | H01L 21/67369 |
| JP | 2006120791 A | * | 5/2006 | | |
| JP | 2006120791 A | | 5/2006 | | |
| JP | 2006332261 A | * | 12/2006 | | |
| JP | 2006332261 A | | 12/2006 | | |
| JP | 3968142 B2 | | 8/2007 | | |
| JP | 2008-140948 A | | 6/2008 | | |
| JP | 2008140948 A | * | 6/2008 | ....... | H01L 21/67383 |
| JP | 2014-116492 A | | 6/2014 | | |
| WO | WO-2009107254 A1 | * | 9/2009 | ....... | H01L 21/67383 |
| WO | WO-2016033503 A1 | * | 3/2016 | ....... | H01L 21/67383 |
| WO | WO-2016100843 A1 | * | 6/2016 | ....... | H01L 21/67386 |
| WO | WO-2018179324 A1 | * | 10/2018 | .......... | H01L 21/673 |
| WO | WO-2018185894 A1 | * | 10/2018 | ....... | H01L 21/67379 |
| WO | WO-2020136741 A1 | * | 7/2020 | .......... | H01L 21/673 |
| WO | WO-2020185020 A1 | * | 9/2020 | .......... | H01L 21/677 |

* cited by examiner

FIG. 7
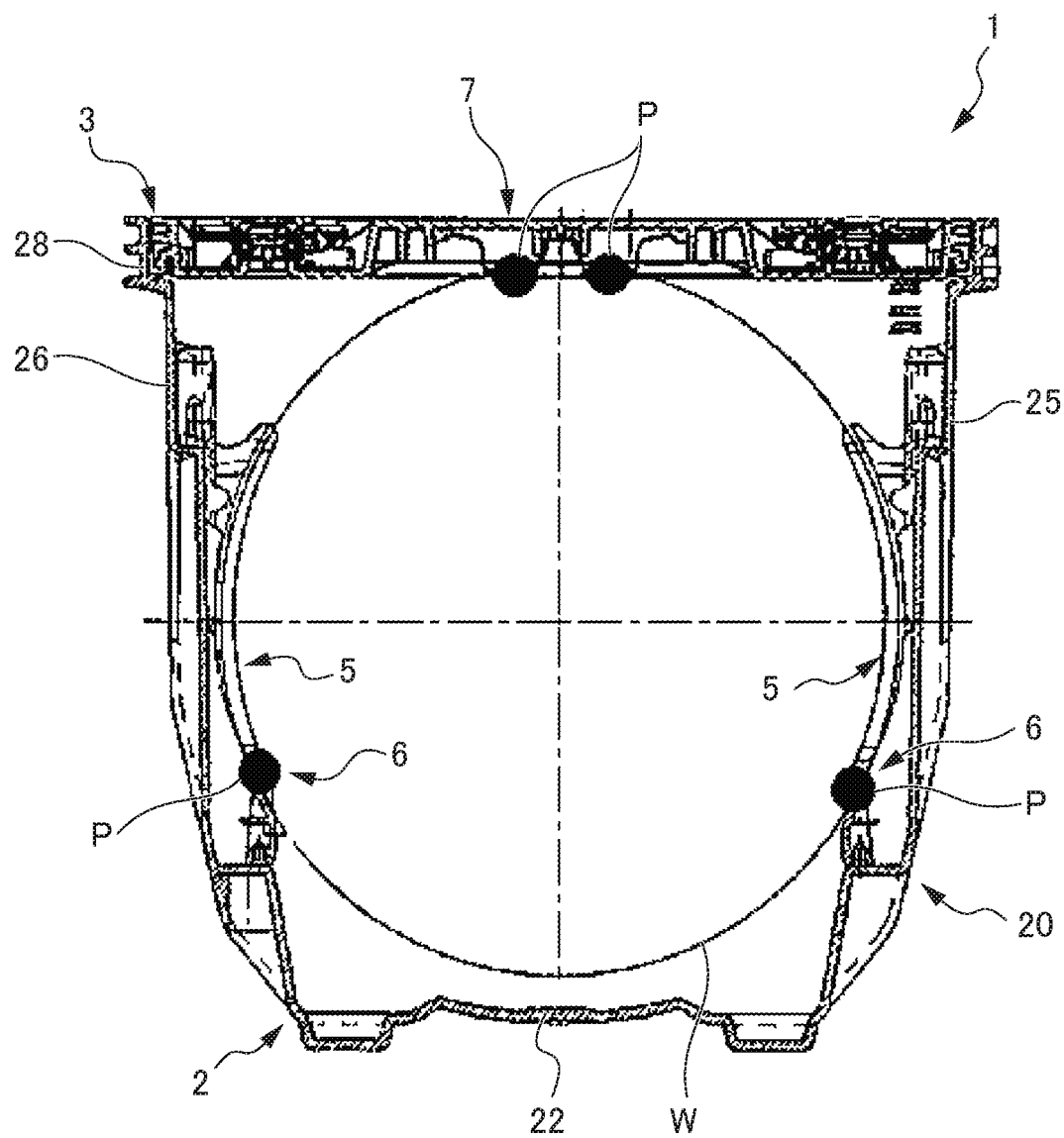
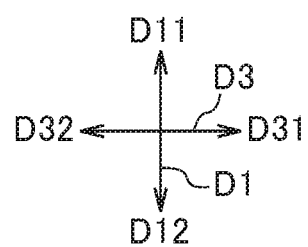

SUBSTRATE STORAGE CONTAINER

TECHNICAL FIELD

The present invention relates to a substrate storage container used, for example, when housing, storing, delivering, and transporting a substrate made from a semiconductor wafer, for example.

BACKGROUND ART

As a substrate storage container for storing and delivering a substrate made from a semiconductor wafer, a substrate storage container has been known conventionally that has a configuration including a container main body and a wafer carrier (for example, refer to Patent Document 1).

The container main body includes a substrate storage space formed therein. The substrate storage space is formed to be surrounded by wall portions, and is able to store a plurality of substrates. A wafer supporting groove is provided for each of a first divided container and a second divided container that constitute the container main body. When the first divided container and the second divided container are combined to form the container main body, the wafer supporting groove of the first divided container and the wafer supporting groove of the second divided container can support edges of the plurality of substrates.

Patent Document 1: Japanese Patent No. 3968142

DISCLOSURE OF THE INVENTION

Problems to be Solved by the Invention

In a substrate storage container, when a first divided container and a second divided container are combined to form a container main body, the substrate storage container supports a substrate by holding the substrate between an inclined face of a wafer supporting groove of the first divided container and an inclined face of a wafer supporting groove of the second divided container, to thereby allow an edge of the substrate to slide on the inclined faces, a result of which the substrate storage container lifts and supports the substrate in a manner being elevated.

For this reason, in order to prevent the occurrence of a failure of the substrate in which the edge of the substrate is not allowed to slide smoothly on the inclined face, and thus the substrate is not elevated while the container main body is formed by combining the first divided container and the second divided container, or conversely, the substrate is not allowed to slide down smoothly on the inclined face while the first divided container is detached from the second divided container, a material having improved sliding property is preferably used for a material of the wafer supporting groove of the first divided container and the wafer supporting groove of the second divided container each including the inclined face.

However, such a material having improved sliding property has poor wear resistance, and thus, it is assumed that such a material is worn during the delivery of the substrate storage container, and thus particles are generated.

It is an object of the present invention to provide a substrate storage container that prevents the generation of particles during the delivery of the substrate storage container and allows a substrate to slide favorably on an inclined face to make it possible to suppress damage to the substrate.

Means for Solving the Problems

The present invention relates to a substrate storage container including: a container main body that includes a tubular wall portion with an opening circumferential portion at which a container main body opening portion is formed at one end and the other end closed, the container main body having a substrate storage space that can store a plurality of substrates by an inner face of the wall portion, and is in communication with the container main body opening portion; a lid body that is removably attached to the container main body opening portion and can close the container main body opening portion; a side substrate support portion that is disposed so as to form a pair in the substrate storage space, and, when the container main body opening portion is not closed by the lid body, can support an edge portion of each of the plurality of substrates in a state in which adjacent substrates among the plurality of substrates are spaced apart at a predetermined interval and arranged in parallel to each other; a lid body side substrate support portion that is disposed at a portion of the lid body that is a part opposing the substrate storage space when the container main body opening portion is closed by the lid body, and can support the edge portion of each of the plurality of substrates; and a back side substrate support portion that is disposed so as to form a pair with the lid body side substrate support portion inside the substrate storage space, can support the edge portion of each of the plurality of substrates, and can support the plurality of substrates in cooperation with the lid body side substrate support portion when the container main body opening portion is closed by the lid body, in which the back side substrate support portion includes: a lower side inclined face that extends in an inclined manner so as to be spaced apart from a center of the substrate storage space and on which an end of a back face of the substrate slides, and a substrate support portion that is located above the lower side inclined face and can support the edge portion of the substrate, in which, when the container main body opening portion is closed by the lid body, the edge portion of the substrate slides on the lower side inclined face and reaches the substrate support portion, and in which at least a portion of the lower side inclined face is configured by a second member that is different from a first member that configures the substrate support portion, and the second member has a lower maximum static friction coefficient and lower wear resistance than the first member.

Furthermore, it is preferable for the second member to be integrally molded with the first member by insert molding or two color molding. Furthermore, it is preferable for the second member to be configured from a component that is different from the first member, and is fixed to the first member. Furthermore, it is preferable for the first member to be configured from polycarbonate resin, and the second member is configured from polybutylene terephthalate resin.

Effects of the Invention

According to the present invention, it is possible to provide a substrate storage container that prevents the generation of particles during the delivery of the substrate storage container and allows a substrate to slide favorably on an inclined face to make it possible to suppress damage to the substrate.

BRIEF DESCRIPTION OF THE DRAWINGS

FIG. 7 is a cross-sectional view of portions P which abut with the substrate W in the substrate storage container 1 according to the first embodiment of the present invention;

PREFERRED MODE FOR CARRYING OUT THE INVENTION

Figure 1:
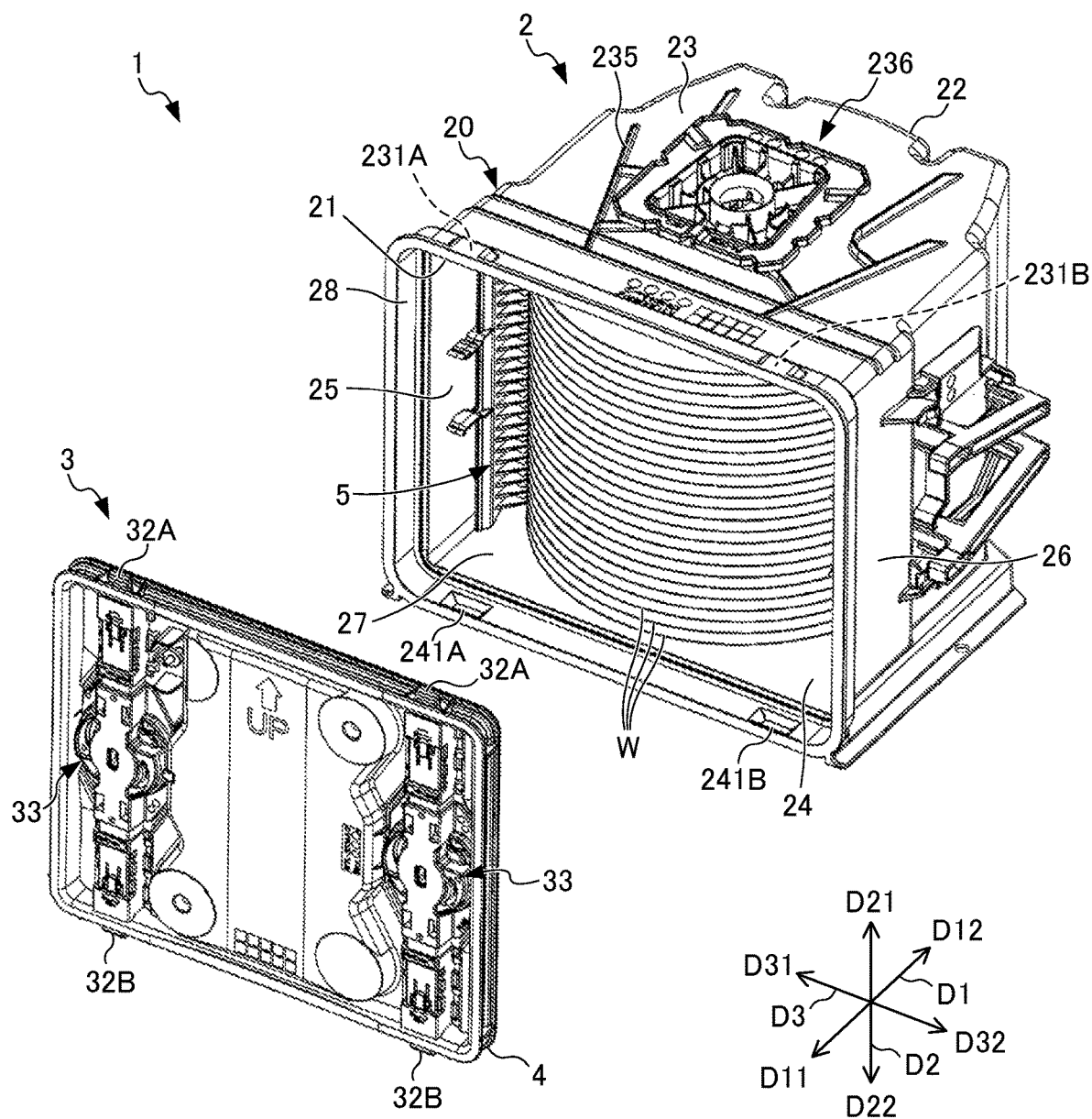
FIG. 1 is an exploded perspective view of a state in which a plurality of substrates W is stored in a substrate storage container 1 according to a first embodiment of the present invention.
Figure 2:
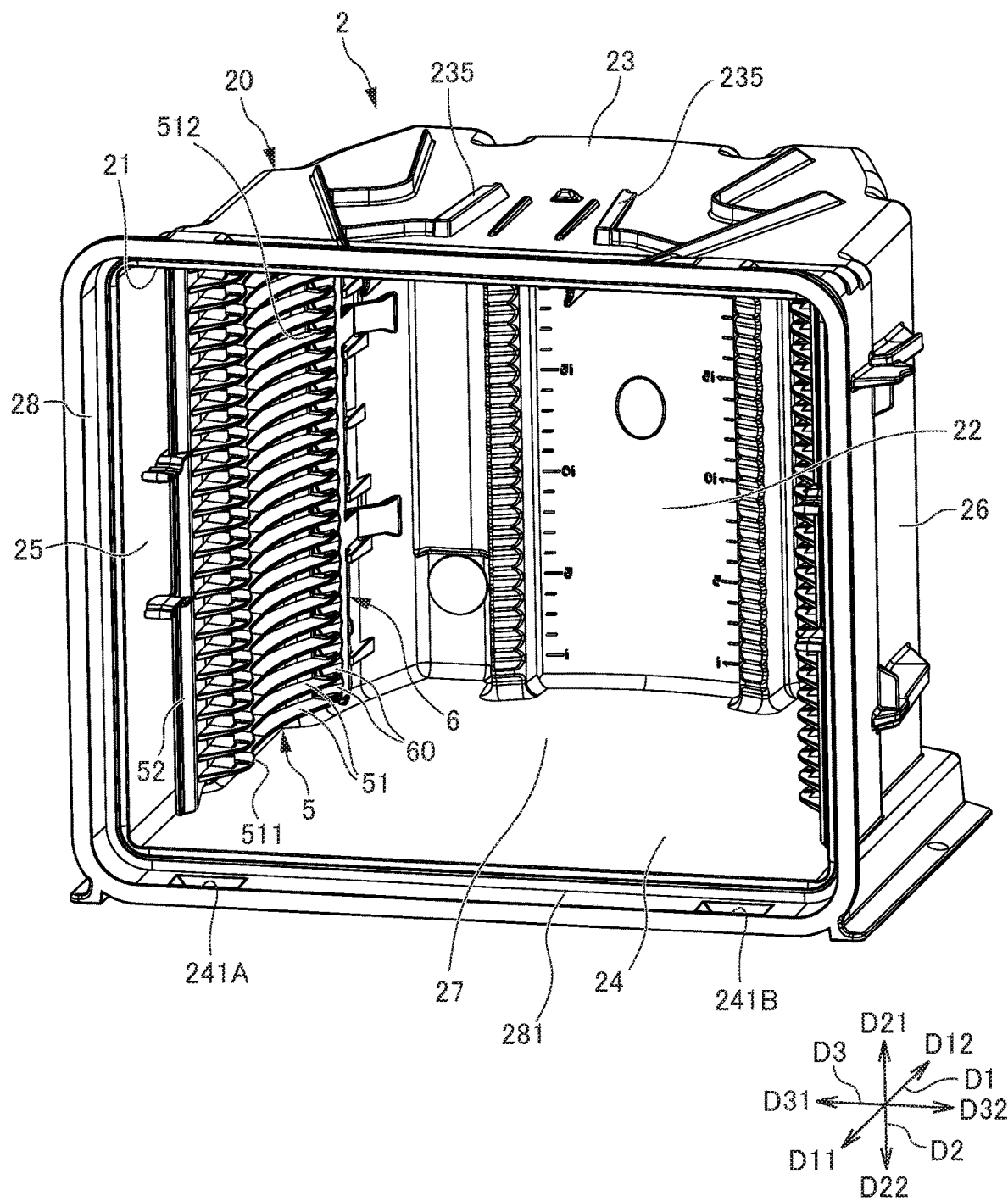
FIG. 2 is a perspective view of a container main body 2 of the substrate storage container 1 according to the first embodiment of the present invention.
Figure 3:
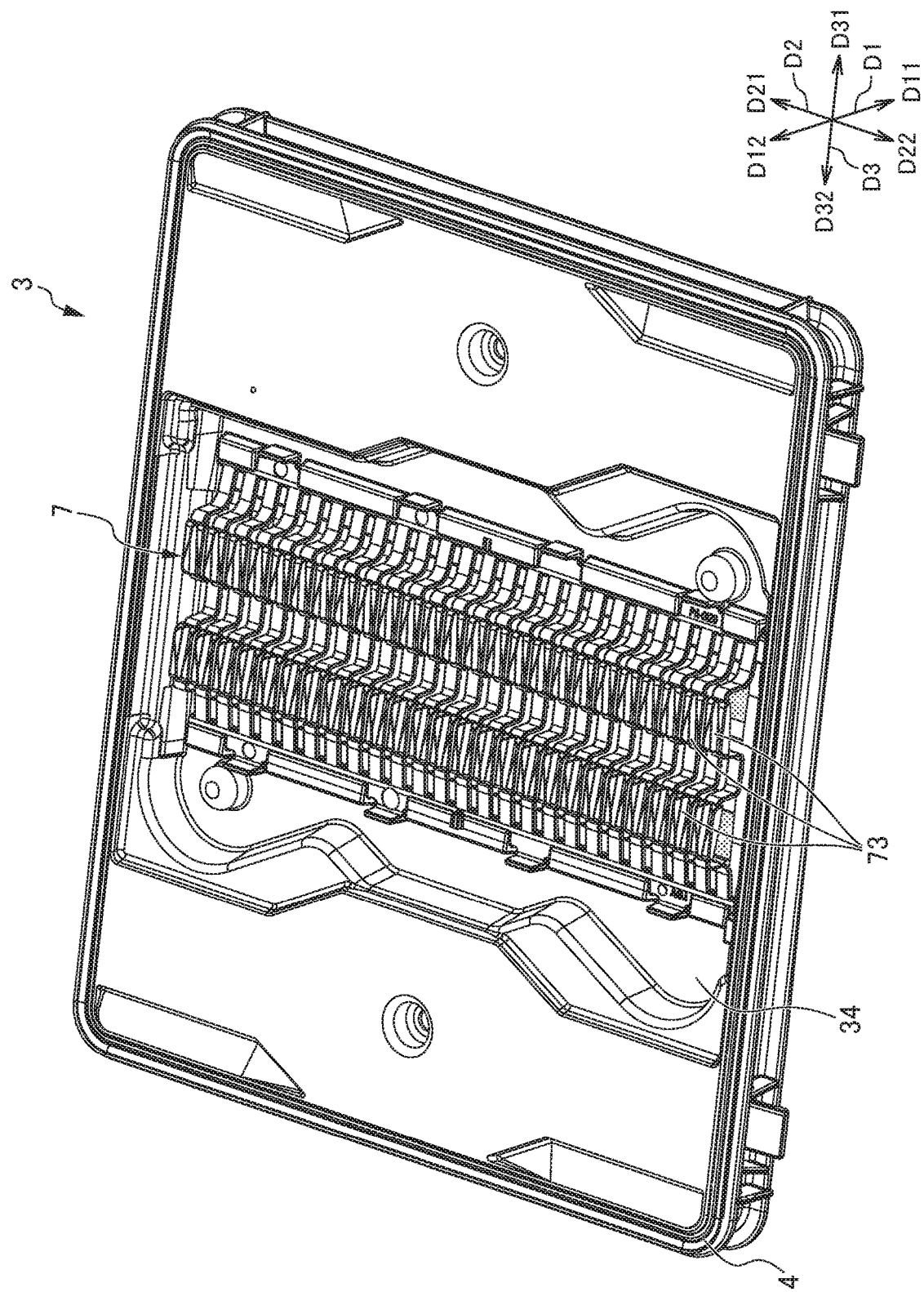
FIG. 3 is a perspective view of a lid body 3 of the substrate storage container 1 according to the first embodiment of the present invention.

In the following, a substrate storage container 1 according to a first embodiment will be described with reference to the drawings. FIG. 1 is an exploded perspective view of a state in which a plurality of substrates W is stored in the substrate storage container 1 according to the first embodiment of the present invention. FIG. 2 is a perspective view of a container main body 2 of the substrate storage container 1 according to the first embodiment of the present application. FIG. 3 is a perspective view of a lid body 3 of the substrate storage container 1 according to the first embodiment of the present invention.

Herein, for the convenience of explanation, the direction from the container main body 2 toward the lid body 3 (the direction from upper right to lower left in FIG. 1) is defined as a forward direction D11, and the opposite direction to the direction D11 is defined as a backward direction D12. Furthermore, these directions are defined as a forward-backward direction D1. Furthermore, the direction from a lower wall 24 to an upper wall 23 described later (upper direction in FIG. 1) is defined as an upper direction D21, and the direction opposite to the direction D21 is defined as a lower direction D22. In addition, these directions are defined as an upper-lower direction D2. Furthermore, the direction from a second side wall 26 toward a first side wall 25 (described later) (the direction from lower right to upper left in FIG. 1) is defined as a left direction D31, and the direction opposite to the direction D31 is defined as a right direction D32. Furthermore, these directions are defined as a left-right direction D3. Arrows indicating these directions are illustrated in the main drawings.

Furthermore, the substrates W (refer to FIG. 1) stored in the substrate storage container 1 are each a disk-like silicon wafer, glass wafer, sapphire wafer, etc., and are each a thin member used in industry. The substrates W according to the present embodiment are each a silicon wafer having a diameter of 300 mm.

As illustrated in FIG. 1, the substrate storage container 1 is used as a shipping container that stores the substrates W each made of a silicon wafer as described above, and transports the substrates W by transportation such as land transportation, air transportation, and marine transportation. The substrate storage container 1 includes a container main body 2 and a lid body 3. The container main body 2 includes a substrate support plate-like portion 5 as a side substrate support portion and a back side substrate support portion 6 (refer to FIG. 2 etc.). The lid body 3 includes a front retainer 7 as a lid body side substrate support portion (refer to FIG. 3, etc.).

The container main body 2 has a tubular wall portion 20 with a container main body opening portion 21 formed at one end and the other end closed. A substrate storage space 27 is formed in the container main body 2. The substrate storage space 27 is formed to be surrounded by the wall portion 20. The substrate support plate-like portion 5 is arranged at a part that is a part of the wall portion 20 forming the substrate storage space 27. As illustrated in FIG. 1, a plurality of substrates W can be stored in the substrate storage space 27.

The substrate support plate-like portion 5 is provided at the wall portion 20 so as to form a pair in the substrate storage space 27. When the container main body opening portion 21 is not closed by the lid body 3, the substrate support plate-like portion 5 abuts an edge portion of each of the plurality of substrates W, thereby making it possible to support the plurality of substrates W in a state in which adjacent substrates W are spaced apart by a predetermined interval and arranged in parallel to each other. The back side substrate support portion 6 is integrally molded with the substrate support plate-like portion 5 at the back side of the substrate support plate-like portion 5.

The back side substrate support portion 6 (refer to FIG. 2, etc.) is provided at the wall portion 20 so as to form a pair with a front retainer 7 (refer to FIG. 3, etc.) within the substrate storage space 27. When the container main body opening portion 21 is closed by the lid body 3, the back side substrate support portion 6 abuts the edge portion of each of the plurality of substrates W, thereby making it possible to support rear portions of the edge portions of the plurality of substrates W.

The lid body 3 is attachable to and detachable from an opening circumferential portion 28 (FIG. 1, etc.) that forms the container main body opening portion 21. The lid body 3 is able to open and close the container main body opening portion 21. The front retainer 7 is a part of the lid body 3 and provided at a part facing a portion which faces the substrate storage space 27 when the container main body opening portion 21 is closed by the lid body 3. The front retainer 7 is arranged so as to form a pair with the back side substrate support portion 6 in the interior of the substrate storage space 27.

When the container main body opening portion 21 is closed by the lid body 3, the front retainer 7 abuts the edge portion of each of the plurality of substrates W, thereby making it possible to support front portions of the edge portions of the plurality of substrates W. When the container main body opening portion 21 is closed by the lid body 3, the front retainer 7 supports the plurality of substrates W in cooperation with the back side substrate support portion 6, thereby retaining the plurality of substrates W in a state in which adjacent substrates W are spaced apart by a predetermined interval and arranged in parallel to each other.

The substrate storage container 1 is configured by a resin such as a plastic material, and, unless explanations are particularly provided, examples of the resin of the plastic material include thermoplastic resin such as polycarbonate, cycloolefin polymer, polyether imide, polyether ketone, polybutylene terephthalate, polyether ether ketone, and liquid crystal polymer, alloys thereof, and the like. In a case of imparting conductivity to the resin of these molding materials, conductive materials such as carbon fiber, carbon powder, carbon nanotubes, and conductive polymer are selectively added. Furthermore, it is possible to add glass fiber, carbon fiber, and the like to enhance the rigidity.

Figure 4:
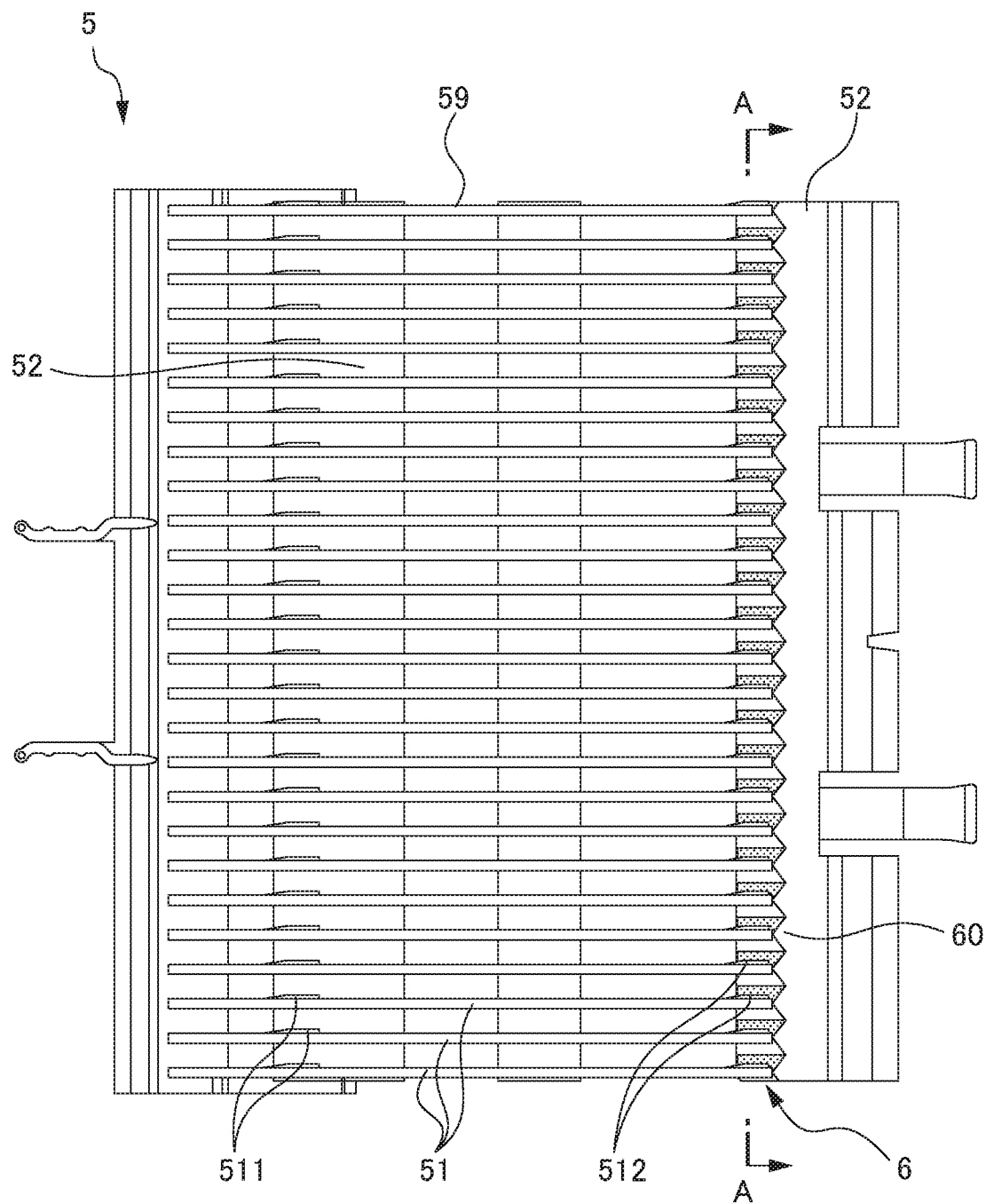
FIG. 4 is a side view of a substrate support plate-like portion 5 of the substrate storage container 1 according to the first embodiment of the present invention.
Figure 5:
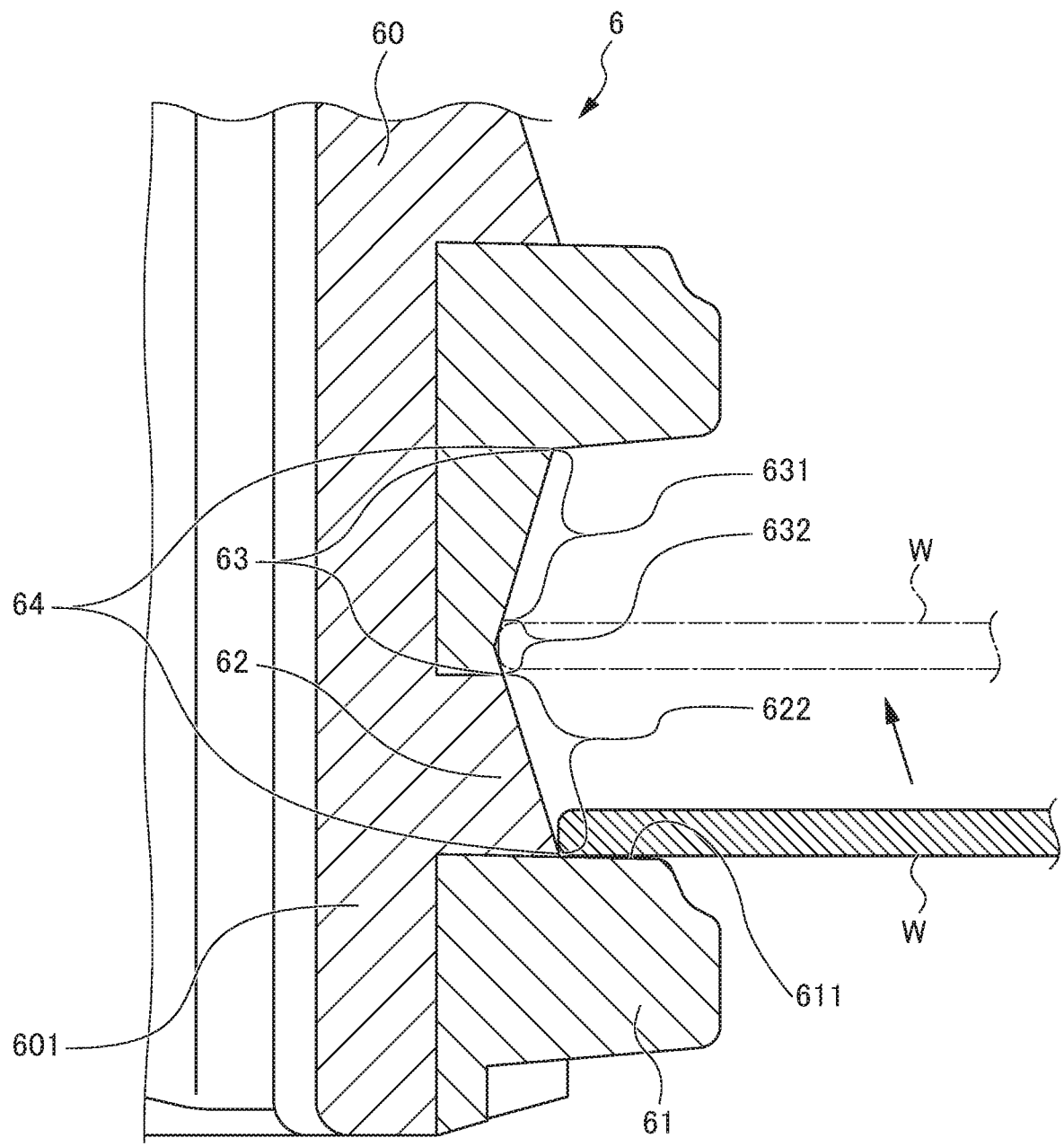
FIG. 5 is an enlarged cross-sectional view along the line A-A of FIG. 4.

In the following, each component will be described in detail. FIG. 4 is a side view of the substrate support plate-like portion 5 of the substrate storage container 1 according to the first embodiment of the present invention. FIG. 5 is an enlarged cross-sectional view along the line A-A of FIG. 4. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured with the abovementioned material and are configured to be integrally molded.

The first side wall 25 faces the second side wall 26. The upper wall 23 faces the lower wall 24. A rear end of the upper wall 23, a rear end of the lower wall 24, a rear end of the first side wall 25, and a rear end of the second side wall 26 are each connected to the back wall 22. A front end of the upper wall 23, a front end of the lower wall 24, a front end of the first side wall 25, and a front end of the second side wall 26 have a positional relationship of facing the back wall 22, and configure the opening circumferential portion 28 that forms the container main body opening portion 21 having a substantially rectangular shape.

The opening circumferential portion 28 is provided at one end of the container main body 2. The back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storage space 27 surrounded by them. The container main body opening portion 21 formed by the opening circumferential portion 28 is in communication with the substrate storage space 27 that is surrounded by the wall portion 20 and formed inside the container main body 2. The substrate storage space 27 can store a maximum of twenty-five of the substrates W.

As illustrated in FIG. 1, latch engaging recess portions 231A, 231B, 241A, and 241B are formed at portions of the upper wall 23 and the lower wall 24 which are portions in the proximity of the opening circumferential portion 28. The latch engaging recess portions 231A, 231B, 241A, and 241B are indented outwardly of the substrate storage space 27. The latch engaging recess portions 231A, 231B, 241A, and 241B are respectively formed, one by one, in the vicinity of both left and right ends of the upper wall 23 and the lower wall 24. The total amount thereof is four.

As illustrated in FIG. 1, ribs 235 are provided so as to be integrally molded with the upper wall 23 at an outer face of the upper wall 23. The ribs 235 enhance the rigidity of the container main body 2. Furthermore, a top flange 236 is fixed at a middle portion of the upper wall 23. The top flange 236 is a member corresponding to a portion of the substrate storage container 1 from which it is hung to be suspended, when suspending the substrate storage container 1 by AMHS (Automated Material Handling System), PGV (Person Guided Vehicle), etc.

The substrate support plate-like portion 5 is an interior component that is provided at each of the first side wall 25 and the second side wall 26, and disposed within the substrate storage space 27 so as to form a pair in the left-right direction D3. More specifically, as illustrated in FIGS. 2 and 4, for example, the substrate support plate-like portion 5 includes a plate portion 51 and a support wall 52 as a plate portion support portion. The plate portion 51 and the support wall 52 are configured to be integrally molded by a resin material. The plate portion 51 is supported by the support wall 52.

The plate portion 51 has a substantially plate-like arc shape. Twenty-five of the plate portions 51 are respectively provided at the first side wall 25 and the second side wall 26 in the upper-lower direction D2. The total number of the plate portions 51 is fifty. The adjacent plate portions 51 are arranged so as to be spaced apart in the upper-lower direction D2 at an interval of 10 mm to 12 mm in a parallel positional relationship. It should be noted that a plate-like member 59 in parallel with the plate portion 51 is further arranged above the plate portion 51 that is located at the top. The plate-like member 59 serves as a guide upon inserting for the substrate W that is located at the top to be inserted into the substrate storage space 27.

Furthermore, the twenty-five plate portions 51 provided at the first side wall 25 and the twenty-five plate portions 51 provided at the second side wall 26 have a positional relationship opposite each other in the left-right direction D3. Furthermore, the fifty plate portions 51 and the plate-like member 59, which is in parallel with the plate portions 51 and serves as a guide, have a positional relationship parallel to the inner face of the lower wall 24. As illustrated in FIG. 2, etc., protruding portions 511 and 512 are provided at an upper face of the plate portion 51. The substrate W supported by the plate portion 51 is only in contact with projecting ends of the protruding portions 511 and 512, and does not contact with the face of the plate portion 51.

The support wall 52 has a plate-like shape extending in the upper-lower direction D2 and a substantially forward-backward direction D1. As illustrated in FIG. 4, the support wall 52 has a predetermined length in a longitudinal direction of the plate portion 51, and is connected to a side end edge of the plate portion 51. The plate-like support wall 52 is curved toward the substrate storage space 27 along an outer side end edge of the plate portion 51.

In other words, the twenty-five plate portions 51 provided at the first side wall 25 are connected to the support wall 52 provided close to the first side wall 25. Similarly, the twenty-five plate portions 51 provided at the second side wall 26 are connected to the support wall 52 provided close to the second side wall 26. The support wall 52 is fixed by each of the first side wall 25 and the second side wall 26.

With the substrate support plate-like portion 5 of such a configuration, it is possible to support the edge portions of the plurality of substrates W in a state in which the adjacent substrates W among the plurality of substrates W are arranged to be spaced apart at a predetermined interval in a parallel positional relationship.

As illustrated in FIGS. 4 and 5, the back side substrate support portion 6 includes a back side end edge support portion 60. The back side end edge support portion 60 is configured to be integrally molded with the plate portion 51 and the support wall 52 at a rear end portion of the plate portion 51 of the substrate support plate-like portion 5. Therefore, the substrate support plate-like portion 5, as the side substrate support portion, and the back side substrate support portion 6 constitute one combined interior component that is fixed to the container main body 2 in the interior of the container main body 2.

Specifically, the twenty-five back side end edge support portions 60 are provided so as to correspond to each of the substrates W that can be stored in the substrate storage space 27. The back side end edge support portion 60 arranged at the first side wall 25 and the second side wall 26 has a positional relationship of forming a pair with the front retainer 7 in the forward-backward direction D1 as described later.

As illustrated in FIG. 5, the back side end edge support portion 60 includes a support portion lower side protruding portion 61 having a lower side abutting face 611, a support portion dower portion 62 having a lower side inclined face 622, and a support portion upper portion 63 having a substrate support portion 632 and an upper side inclined face 631.

Specifically, when the container main body opening portion 21 is not closed by the lid body 3, the lower side abutting face 611 abuts an end edge of a back face of the substrate W to support the substrate W. The lower side inclined face 622 is configured by an inclined face that extends in an inclined manner from the upper end portion of the lower side abutting face 611 so as to be spaced apart from the center of the substrate storage space 27 (right side in FIG. 5) as advancing in the upper direction D21, and the end of the back face of the substrate W slides on the inclined face. The substrate support portion 632 as a connecting portion that connects the inclined face of the lower side abutting face 611 and the inclined face of the upper side inclined face 631 with each other includes a support face that is connected to the upper end portion of the lower side inclined face 622, is curved in a substantially V-shape, and supports an edge portion of the substrate W. The upper side inclined face 631 is configured by an inclined face that extends in an inclined manner from the upper end portion of the substrate support portion 632 so as to approach the center of the substrate storage space 27 (right side in FIG. 6A) as advancing in the upper direction D21.

The lower side inclined face 622, the substrate support portion 632, and the upper side inclined face 631 are arranged above the lower side abutting face 611, and form a V-shape groove 64 which is a recessed groove that is indented so as to be spaced apart from the center of the substrate storage space 27 and with which the end of the substrate W can be engaged. The substrate support portion 632 constitutes an apex of the V-shape groove 64. When the container main body opening portion 21 is closed by the lid body 3, the substrate W slides on the lower side inclined face 622 to thereby be elevated, and when the substrate W reaches the position of the apex of the V-shape groove 64, the end edge of the front face and the end edge of the back face of the substrate W each abut the substrate support portion 632. The substrate support portion 632 supports the edge of the substrate W at the V-shape groove 64.

The support portion lower side protruding portion 61 including the lower side abutting face 611 and the support portion upper portion 63 including the upper side inclined face 631 and the substrate support portion 632 are configured to be integrally molded from polycarbonate (PC) as a first member which is the same material. The support portion lower portion 62 including the lower side inclined face 622 is configured from polybutylene terephthalate (PBT) as a second member that is a material different from that of the support portion lower side protruding portion 61 including the lower side inclined face 622 and the support portion upper portion 63 including the upper side inclined face 631 and the substrate support portion 632. In other words, the entire lower side inclined face 622 is configured from polybutylene terephthalate (PBT). The support portion lower side protruding portion 61 and the support portion upper portion 63, and the support portion lower portion 62 are integrally formed by two color molding or insert molding. One of the plurality of lower side inclined faces 622 is integrally connected to the other adjacent lower side inclined faces 622 which are located at the upper side and the lower side by an upper-lower direction extending portion 601.

The lower side abutting face 611, the substrate support portion 632, and the upper side inclined face 631 that are configured from polycarbonate (PC) has higher wear resistance than the lower side inclined face 622 that is configured from polybutylene terephthalate (PBT). The degree of wear resistance can be examined by the examination method according to JIS K 7204. Furthermore, the lower side inclined face 622, the lower side abutting face 611, the substrate support portion 632, and the upper side inclined face 631 are subjected to surface treatment such as surface roughening as appropriate, so that the maximum static friction coefficient in a case of causing the lower side inclined face 622 to slide with respect to the substrate W becomes relatively lower than the maximum static friction coefficient in any case of causing the lower side abutting face 611, the substrate support portion 632, and the upper side inclined face 631 to slide with respect to the substrate W.

Figure 6:
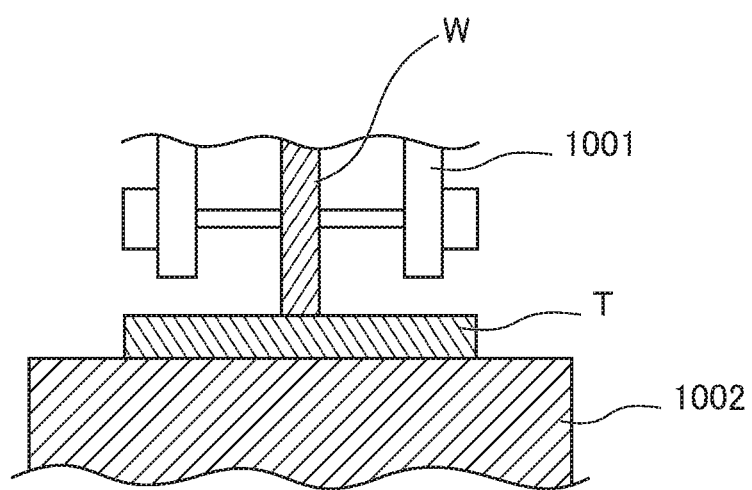
FIG. 6 is an enlarged cross-sectional view of test equipment for measuring a maximum static friction coefficient of a material constituting the substrate support plate-like portion 5 of the substrate storage container 1 according to the first embodiment of the present invention.

The values of the maximum static friction coefficient of the lower side inclined face 622, the lower side abutting face 611, the substrate support portion 632, and the upper side inclined face 631 with respect to the substrate W are obtained by a test in which a portion T (refer to FIG. 6) is prepared which is obtained by partially cutting the portions including the lower side inclined face 622, the lower side abutting face 611, the substrate support portion 632, and the upper side inclined face 631, and furthermore, a portion of the outer face except for the cut surface of T is caused to slide with respect to the substrate W. FIG. 6 is an enlarged cross-sectional view of test equipment for measuring the maximum static friction coefficient of a material that constitutes the substrate support plate-like portion 5 of the substrate storage container 1 according to the first embodiment of the present invention. The substrate W used herein is a substrate that is obtained by partially cutting the substrate W, and slides on a portion of the outer face except for the cut surface of the substrate W. In the test, the values of the maximum static friction coefficient can be examined by using a "reciprocating frictional resistance measuring instrument" (for example, the surface property measurement equipment Type: 38 manufactured by Shinto Scientific Co., Ltd.).

More specifically, as illustrated in FIG. 6, the value of the maximum static friction coefficient can be examined in such a manner that the substrate that is obtained by partially cutting the substrate W is fixed to an arm 1001 of the reciprocating friction resistance measurement device, and is caused to slide by 5 mm with respect to the portion T which is obtained by partially cutting any of the lower side inclined face 622, the lower side abutting face 611, the substrate support portion 632, and the upper side inclined face 631 and fixed on a pedestal 1002, with the load of 350 gf and the speed of 1500 mm/min.

As illustrated in FIG. 1, etc., the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. A ring-like sealing member 4 is attached to a face which is an inner face (a face on the back side of the lid body 3 illustrated in FIG. 1) of the lid body 3 and faces a face of a step portion (a sealing face 281) formed at a location of the opening circumferential portion 28 in the backward direction D12 when the lid body 3 closes the container main body opening portion 21. The sealing member 4 is made from various types of thermoplastic elastomers which are elastically deformable polyester based and polyolefin based, etc., fluorine containing rubber, silicon rubber, etc. The sealing member 4 is arranged so as to go around the circumferential edge portion of the lid body 3.

When the lid body 3 is attached to the opening circumferential portion 28, the sealing member 4 is caught by the sealing face 281 and the inner face of the lid body 3 to thereby be elastically deformed, and the lid body 3 closes the container main body opening portion 21 in a sealed state. When the lid body 3 is removed from the opening circumferential portion 28, it is possible to load or unload the substrates W relative to the substrate storage space 27 in the container main body 2.

A latching mechanism is provided at the lid body 3. The latching mechanism is provided in the vicinity of both left and right end portions of the lid body 3. As illustrated in FIG. 1, the latching mechanism includes two upper side latch portions 32A which can project from the upper side of the lid body 3 in the upper direction D21, and two lower side latch portions 32B that can project from the lower side of the lid body 3 in the lower direction D22. The two upper side latch portions 32A are arranged in the vicinity of both left and right ends of the upper side of the lid body 3, and the two lower side latch portions 32B are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portions 32A and the lower side latch portions 32B to respectively project from the upper side and the lower side of the lid body 3, as well as possible to establish a state not projecting from the upper side and the lower side of the lid body 3. By the upper side latch portions 32A projecting from the upper side of the lid body 3 in the upper direction D21 to engage with the latch engaging recess portions 231A and 231B of the container main body 2 and the lower side latch portions 32B projecting from the lower side of the lid body 3 in the lower direction D22 to engage with the latch engaging recess portions 241A and 241B of the container main body 2, the lid body 3 is fixed to the opening circumferential portion 28 of the container main body 2.

As illustrated in FIG. 3, on the inner side of the lid body 3, a recessed portion 34 that is indented outwardly of the substrate storage space 27 is formed. The front retainer 7 is fixedly provided at a portion of the lid body 3 inside the recessed portion 34.

The front retainer 7 includes front retainer substrate receiving portions 73. The front retainer substrate receiving portions 73 are arranged so as to form pairs, each having two front retainer substrate receiving portions 73 that, are spaced apart at a predetermined interval in the left-right direction D3. The front retainer substrate receiving portions 73 that are arranged so as to form the pairs, each having two front retainer substrate receiving portions 73, are provided in a state in which twenty-five pieces of the pairs are arranged in parallel in the upper-lower direction D2, and each of them is supported by an elastically deformable leg portion. When the substrates W are stored in the substrate storage space 27 and the space is closed by the lid body 3, the front retainer substrate receiving portion 73 sandwiches and supports the substrates W in a state in which the end edge of the edge of each of the substrates W is being biased toward the center of the substrate storage space 27.

Next, operations upon storing the substrates W in the substrate storage space 27 in the above-described substrate storage container 1 and closing the container main body opening portion 21 by the lid body 3 will be described. First, as illustrated in FIG. 1, the container main body 2 is disposed so that the forward-backward direction D1 and the left-right direction D3 have a positional relationship of being in parallel with each other with respect to a horizontal plane. Next, a plurality of substrates W are each placed on the protruding portions 511 and 512 of the plate portion 51 of the substrate support plate-like portion 5 and the lower side abutting face 611 of the support portion lower side protruding portion 61 of the back side end edge support portion 60.

Next, the lid body 3 is made to approach the container main body opening portion 21 to thereby abut the front retainer substrate receiving portion 73 of the front retainer 7. Thereafter, when the lid body 3 is made to further approach the container main body opening portion 21, as illustrated in FIG. 5, the end edge of the back face of the end of the substrate W in a state of abutting the lower side abutting face 611 abuts the lower side inclined face 622 of the back side end edge support portion 60, and slides on the lower side inclined face 622 to thereby be elevated.

At this time, since the lower side inclined face 622 is configured by PBT, the sliding property of the substrate W with respect to the lower side inclined face 622 is favorable, and the sliding between the end edge of the back face of the edge portion of the substrate W and the lower side inclined face 622 is smooth, thereby suppressing the generation of particles from this sliding. Thereafter, when the substrate W reaches the apex of the V-shape groove 64, the end edge of the front face of the substrate W and the end edge of the back face of the substrate W abut the substrate support portion 632, and the edge portion of the substrate W is supported by the substrate support portion 632 at the V-shape groove 64.

During the delivery of the substrate storage container 1, in a state in which the edge portion of the substrate W is supported by the substrate support portion 632, the substrate support portion 632 is configured from PC having higher wear resistance than PBT. Therefore, in a case in which the substrate storage container 1 is vibrated, the generation of particles due to the sliding of the substrate support portion 632 with respect to the substrate W is suppressed.

Next, a test for examining effects derived from the present embodiment was conducted. In the test, the substrates W were stored in the substrate storage container 1 configured by the substrate support portion 632 and the front retainer 7 from different materials, and a predetermined vibration was applied for a predetermined period of time to perform comparison of the generated amount of particles.

More specifically, substrate storage containers provided with the support portion upper portion 63 including the substrate support portion 632, the support portion lower side protruding portion 61, and the front retainer 7 respectively made from polycarbonate (PC), polyester elastomer (PEE), polybutylene terephthalate (PBT), a mixture of PC and PBT, and a mixture of PC and polytetrafluoroethylene tetrafluoroethylene were prepared as Present Invention Article, Comparative Article 1, Comparative Article 2, Comparative Article 3, and Comparative Article 4. For each of them, the surfaces of the substrate support portion 632 and the front retainer 7 were subjected to surface treatment, and the surfaces having four types of surface roughness of about 0.5 μm (mirror), about 5 μm (low roughness), about 50 μm (medium roughness), and about 100 μm (high roughness) were prepared.

Figure 8:
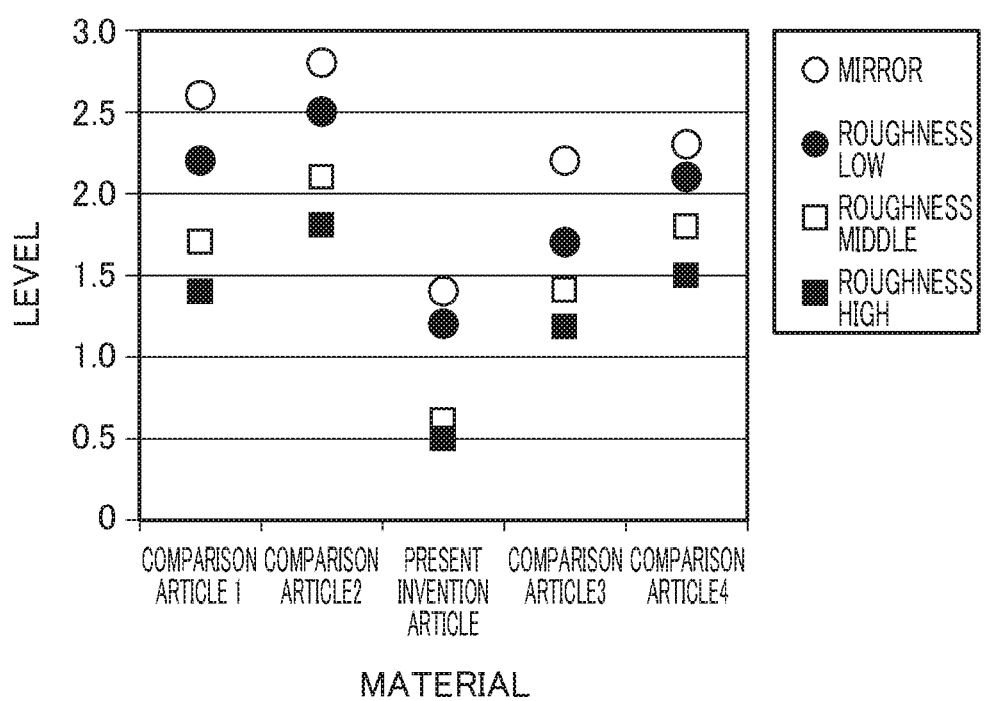
FIG. 8 is a graph showing a result of a test that investigates the effects of the substrate storage container 1 according to the first embodiment of the present invention.

Thereafter, the substrates N were stored in the substrate storage containers, and the substrate storage containers were vibrated in the upper-lower direction D2 for 5 minutes with the acceleration of 0.35 G. With this procedure, the generated amounts of particles at the contact point between the substrate W and the substrate support portion 632 and the contact point between the substrate W and the front retainer 7, which are denoted as P in FIG. 7, were obtained with values indicating the depth of color due to the particles in the range of 0 to 3. The test results are shown in Table 1 and FIG. 8. FIG. 7 is a cross-sectional view illustrating the portion P abutting the substrate W in the substrate storage container 1 according to the first embodiment of the present invention. FIG. 8 is a graph showing results of tests examining the effects of the substrate storage container 1 according to the first embodiment of the present invention.

TABLE 1

| | SURFACE STATE | | | |
| --- | --- | --- | --- | --- |
| RAW MATERIAL | MIRROR | LOW ROUGH-NESS | MEDIUM ROUGH-NESS | HIGH ROUGH-NESS |
| COMPARATIVE ARTICLE 1 | 2.6 | 2.2 | 1.7 | 1.4 |
| COMPARATIVE ARTICLE 2 | 2.8 | 2.5 | 2.1 | 1.8 |
| PRESENT INVENTION ARTICLE | 1.4 | 1.2 | 0.6 | 0.5 |
| COMPARATIVE ARTICLE 3 | 2.2 | 1.7 | 1.4 | 1.2 |
| COMPARATIVE ARTICLE 4 | 2.3 | 2.1 | 1.8 | 1.5 |

As illustrated in Table 1 and FIG. 8, in a case of Present Invention Article in which PC having superior wear resistance was used for the portion abutting the substrate W stored in the substrate storage container, it was found that the generated amount of particles were suppressed at a low level in any surface state of the surface roughness. On the contrary, it was found that the generated amounts of particles were high in the cases of the other materials.

Based on the results, it was that the portion abutting the substrate W during the delivery of the substrate storage container 1, more specifically, the substrate support portion 632 and the front retainer 7 were preferably configured by PC having superior wear resistance. Further, as described above, the lower side inclined face 622 on which the end edge of the back face of the substrate W slides while the container main body opening portion 21 is closed by the lid body 3 is preferably configured by PBT having a smaller maximum static friction coefficient with respect to the substrate W. Therefore, it was found that configuring the substrate support portion 632 and the front retainer 7 from PC and configuring the lower side inclined face 622 from PBT allows the generation of particles to be suppressed, and when the container main body opening portion 21 is closed by the lid body 3, the sliding of the end edge of the back face of the substrate W on the lower side inclined face 622 can be smooth.

With the substrate storage container 1 according to the first embodiment including the abovementioned configuration, it is possible to obtain the following effects. As described above, the substrate storage container 1 includes: a container main body 2 that includes a tubular wall portion 20 with an opening circumferential portion 28 at which a container main body opening portion 21 is formed at one end and the other end closed, the container main body 2 having a substrate storage space 27 that can store a plurality of substrates W by an inner face of the wall portion 20, and is in communication with the container main body opening portion 21; a lid body 3 that is removably attached to the container main body opening portion 21 and can close the container main body opening portion 21; a substrate support plate-like portion 5, as a side substrate support portion, that is disposed so as to form a pair in the substrate storage space 27, and, when the container main body opening portion 21 is not closed by the lid body 3, can support an edge portion of each of the plurality of substrates W in a state in which adjacent substrates W among the plurality of substrates W are spaced apart at a predetermined interval and arranged in parallel to each other; a front retainer 7, as a lid body side substrate support portion, that is disposed at a portion of the lid body 3 that is a part opposing the substrate storage space 27 when the container main body opening portion 21 is closed by the lid body 3, and can support the edge portion of each of the plurality of substrates W; and a back side substrate support portion 6 that is disposed so as to form a pair with the front retainer 7 inside the substrate storage space 27, can support the edge portion of each of the plurality of substrates W, and can support the plurality of substrates W in cooperation with the front retainer 7 when the container main body opening portion 21 is closed by the lid body 3. The back side substrate support portion 6 extends in an inclined manner so as to be spaced apart from the center of the substrate storage space 27, and includes the lower side inclined face 622 on which the end of the back face of the substrate W slides and the substrate support portion 632 that is located above the lower side inclined face 622 and can support the edge portion of the substrate W. While the container main body opening portion 21 is closed by the lid body 3, the edge portion of the substrate W slides on the lower side inclined face 622 to reach the substrate support portion 632, at least a portion of the lower side inclined face 622 is configured from PBT as the second member which is different from PC as the first member constituting the substrate support portion 632, and the second member has a lower maximum static friction coefficient and lower wear resistance than the first member.

With such a configuration described above, the sliding of the substrate W is smooth on the lower side inclined face 622 configured from PBT, which allows the end edge of the back face of the substrate W to be elevated smoothly with respect to the lower side inclined face 622. Therefore, failure in elevation of the substrate W with respect to the lower side inclined face 622 due to the sliding of the substrate W on the lower side inclined face 622 being not smooth while the container main body opening portion 21 is closed by the lid body 3 is suppressed, and furthermore, failure in sliding down of the substrate W due to the substrate W not sliding down smoothly with respect to the lower side inclined face 622 while the lid body 3 is opened from the container main body opening portion 21 is suppressed. As a result of this, it is possible to suppress the occurrence of damage to the substrate W. Furthermore, wear resistance is high at the substrate support portion 632 which abuts the substrate W during the delivery of the substrate storage container 1. For this reason, it is possible to reduce the generation of particles and the amount of resin attached to the substrate W.

Furthermore, the second member configured from PBT is integrally molded with the first member configured from PC by insert molding or two color molding. With such a configuration, it is possible to easily realize configuring at least a portion of the lower side inclined face 622 with the second member which is different from the first member configuring the substrate support portion 632.

Furthermore, the first member is configured from polycarbonate resin (PC), and the second member is configured from polybutylene terephthalate (PBT). With such a configuration, it is easy to configure the second member having a lower maximum static friction coefficient and lower wear resistance than the first member.

Figure 9:
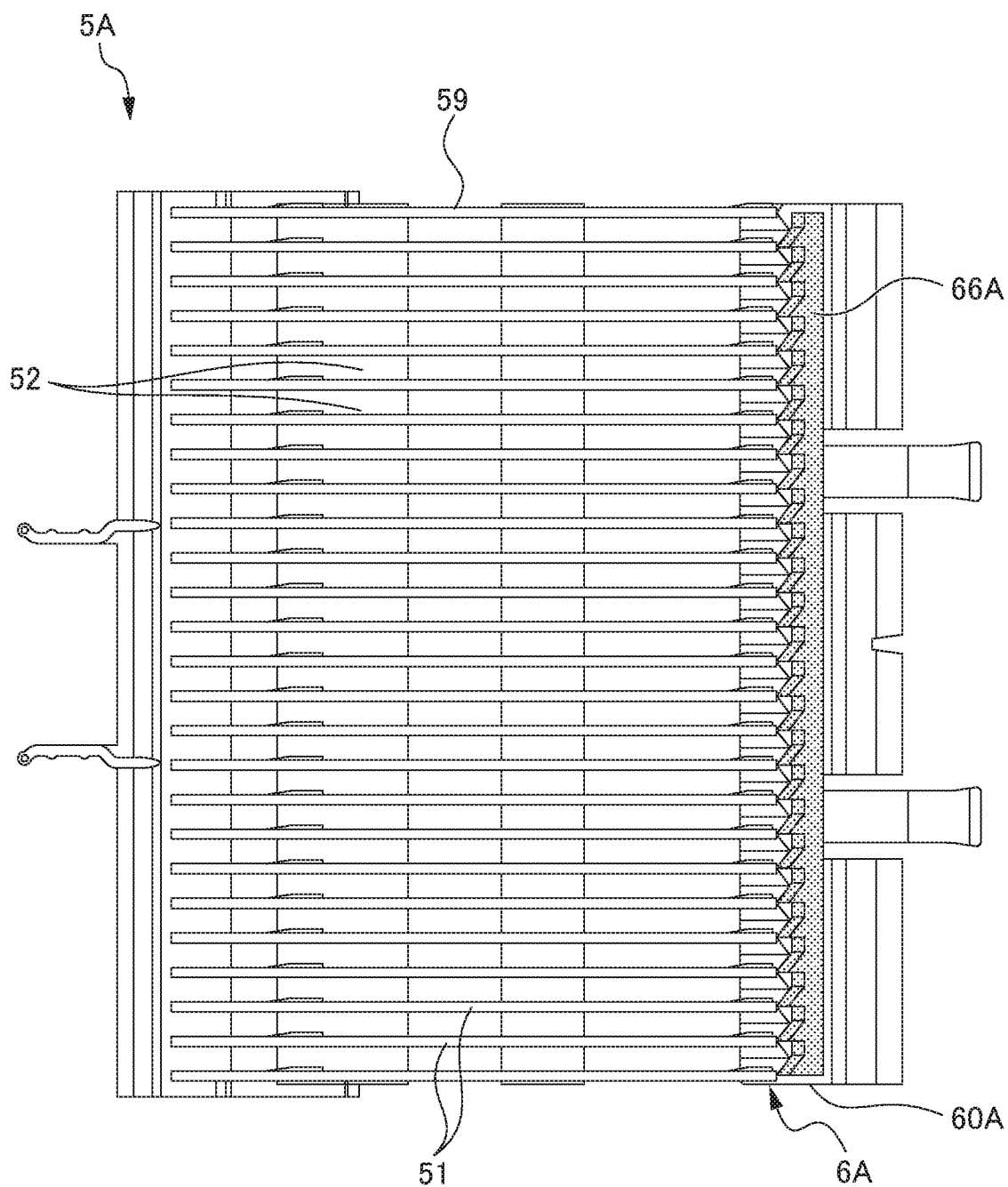
FIG. 9 is a side view of a substrate support plate-like portion 5A of a substrate storage container according to a second embodiment of the present invention.
Figure 10:
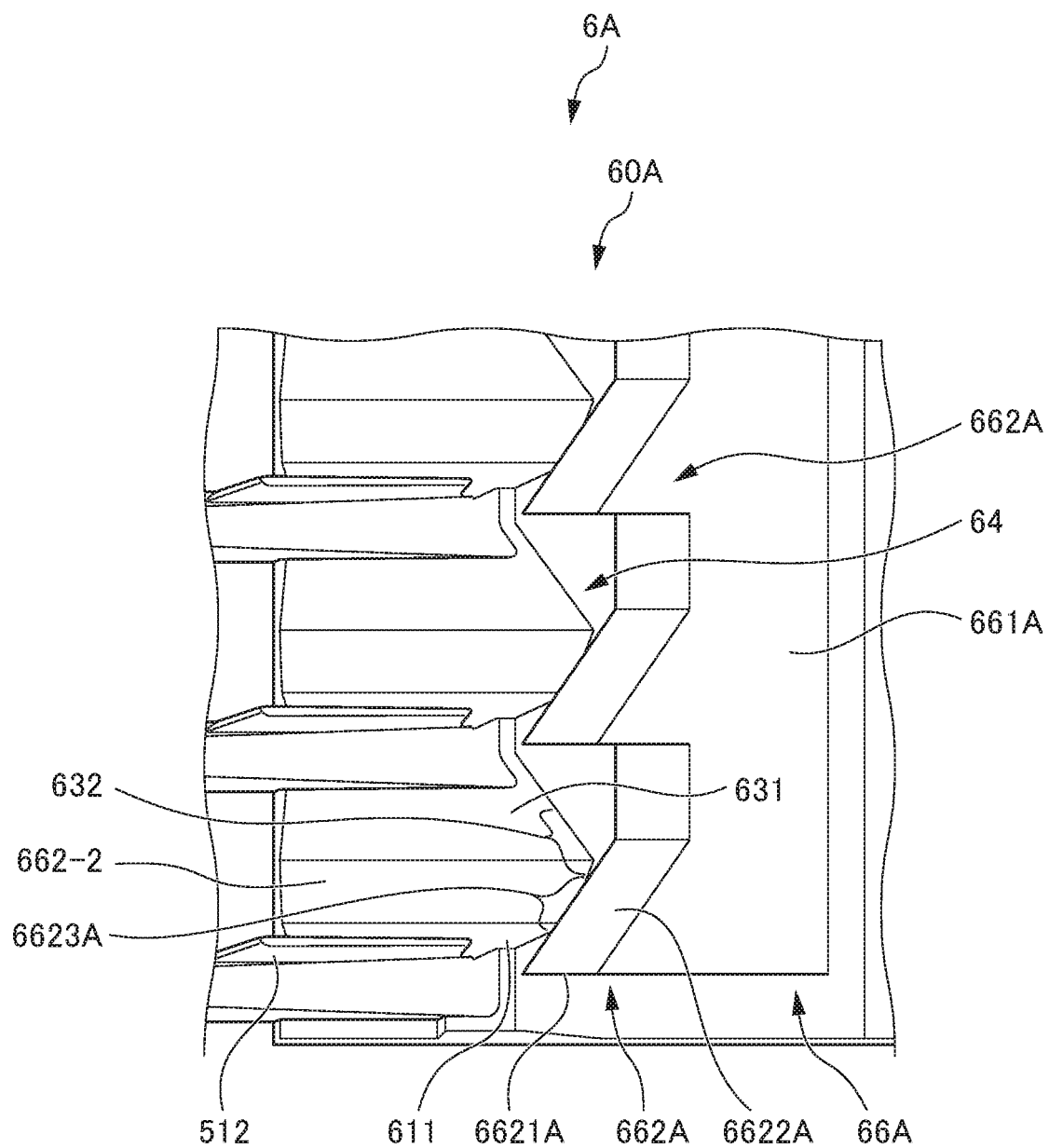
FIG. 10 is an enlarged perspective view of a back side substrate support portion 6A of the substrate storage container according to the second embodiment of the present invention.
Figure 11:
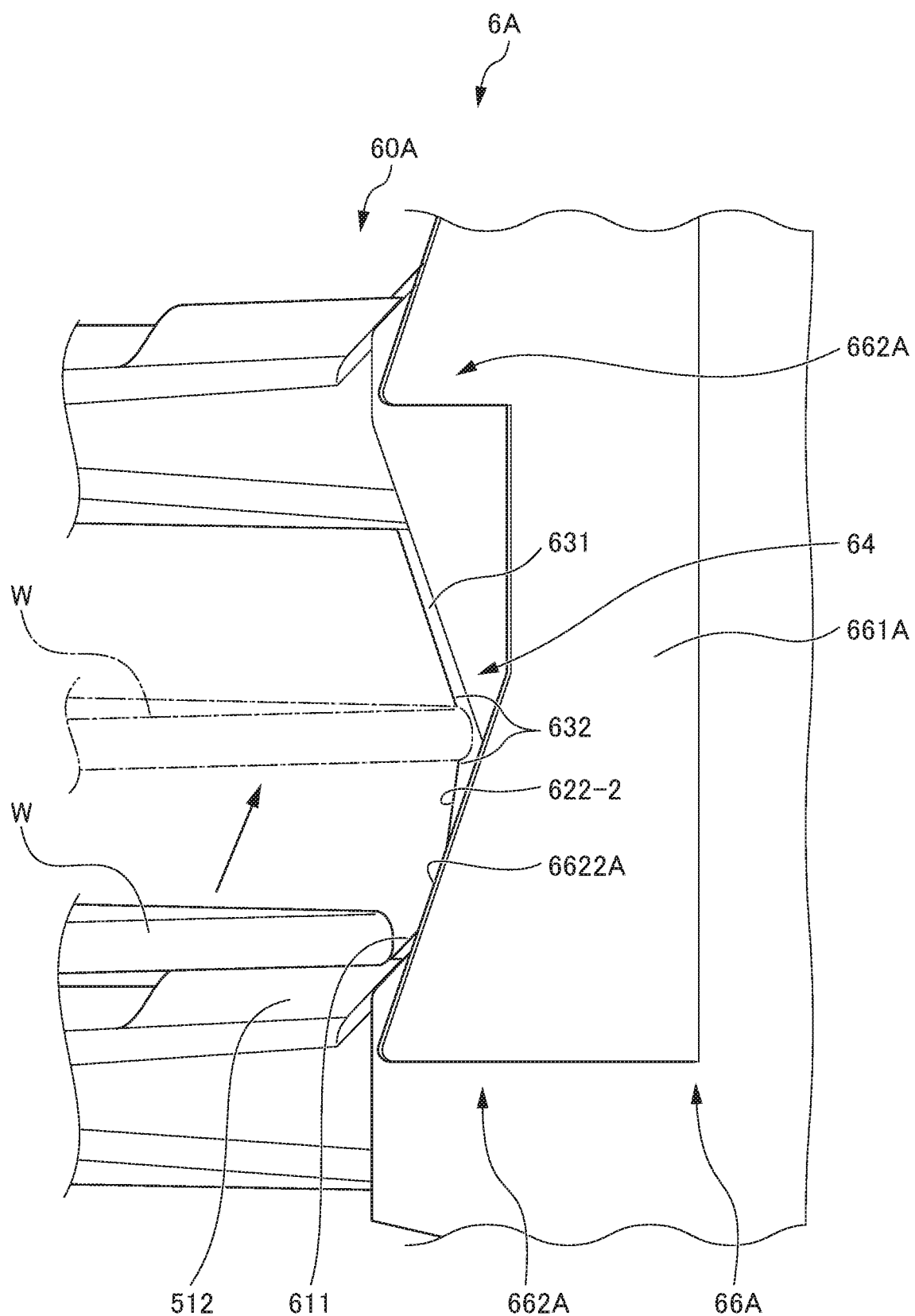
FIG. 11 is an enlarged cross-sectional view of the back side substrate support portion 6A of the substrate storage container according to the second embodiment of the present invention.

Next, a substrate storage container according to a second embodiment of the present invention will be described with reference to the drawings. FIG. 9 is a side view of a substrate support plate-like portion 5A of a substrate storage container according to the second embodiment of the present invention. FIG. 10 is an enlarged perspective view of a back side substrate support portion 6A of the substrate storage container according to the second embodiment of the present invention. FIG. 11 is an enlarged cross-sectional view of the back side substrate support portion 6A of the substrate storage container according to the second embodiment of the present invention.

The substrate storage container of the second embodiment differs from that of the first embodiment in that an attachment member 66A on which the substrate W slides is fixed to the back side end edge support portion 60A, and the shape of the back side end edge support portion 60A is different from that of the back side end edge support portion 60 in the first embodiment. The second embodiment is the same as the first embodiment except for the configuration described above. Therefore, the same members are illustrated with the same reference numerals, and the descriptions thereof will be omitted.

The attachment member 66A includes a main body portion 661A having a rectangular column shape and a projecting portion 662A that projects from the main body portion 661A in a horizontal direction. The projecting portion 662A includes a projection portion horizontal face 6621A extending horizontally and a projecting portion inclined face 6622A extending in an inclined manner from a projecting end portion of the projecting portion horizontal face 6621A in an obliquely upwards direction. A middle portion 6623A in an extending direction of the projecting portion inclined face 6622A constitutes a lower side inclined face on which the substrate W slides, which is similar to the lower side inclined face 622 of the first embodiment, when the container main body opening portion 21 is closed by the lid body 3. On the contrary, a lower side inclined face 622-2 of the back side end edge support portion 60A of the back side substrate support portion 6A is inclined at a larger angle with respect to the upper-lower direction D2 than the lower side inclined face 622 in the first embodiment, and the lower side inclined face 622-2 has almost no abutting or sliding of the substrate W. The attachment member 66A is configured from polybutylene terephthalate (PBT).

Next, operations upon storing the substrates W in the substrate storage space 27 in the above-described substrate storage container and closing the container main body opening portion 21 by the lid body 3 will be described. First, as illustrated in FIG. 1, the container main body 2 is disposed so that the forward-backward direction D1 and the left-right direction D3 have a positional relationship of being in parallel with each other with respect to a horizontal plane. Next, as illustrated in FIG. 11, a plurality of substrates W are each placed on the protruding portions 511 and 512 of the plate portion 51 of the substrate support plate-like portion 5 and the lower side abutting face 611 of the support portion lower side protruding portion 61 of the back side end edge support portion 60A.

Next, the lid body 3 (refer to FIG. 3, etc.) is made to approach the container main body opening portion 21 to thereby abut the front retainer substrate receiving portion 73 of the front retainer 7. Thereafter, when the lid body 3 is made to further approach the container main body opening portion 21, the end edge of the back face of the end of the substrate W in a state of abutting the lower side abutting face 611 rises up, and slides on the projecting portion inclined face 6622A to thereby be elevated.

At this time, since the projecting portion inclined face 6622A is configured from PBT, the sliding property of the substrate W with respect to the projecting portion inclined face 6622A is favorable, and the sliding between the end edge of the back face of the edge portion of the substrate W and the projecting portion inclined face 6622A is smooth. Thereafter, as illustrated in FIG. 11 by a one-dot chain line, when the substrate W reaches the substrate support portion 632 which is located at the apex of the V-shape groove 64, the end edge of the back face of the substrate W rises up from the projecting portion inclined face 6622A, the end edge of the front face and the end edge of the back face of the substrate W respectively abut the substrate support portion 632, and the edge portion of the substrate W is supported by the substrate support portion 632 at the V-shaped groove 64.

During the delivery of the substrate storage container, in a state in which the edge portion of the substrate W is supported by the substrate support portion 632, similarly to that of the first embodiment, the substrate support portion 632 is configured from PC having higher wear resistance than PBT. Therefore, in a case in which the substrate storage container is vibrated, the generation of particles due to the sliding of the substrate support portion 632 with respect to the substrate W is suppressed.

With the substrate storage container according to the present embodiment of the configuration described above, the following effects are obtained. The second member configured from PBT is configured with the attachment member 66A which is a different component from the first member configured with PC, and is fixed to the first member. With such a configuration, it is unnecessary for the first member and the second member to be integrally formed with each other by insert molding or two color molding upon manufacturing the back side substrate support portion 6A. This makes it possible to easily manufacture the back side substrate support portion 6A.

The present invention is not limited to the above-mentioned embodiments, and modifications thereto within the technical scope claimed in the claims are possible.

For example, the shapes of the container main body and the lid body and the number and dimensions of substrates W that can be stored in the container main body are not limited to the shape of the container main body 2 and the lid body 3 and the number and dimensions of the substrates W that can be stored in the container main body 2 according to the present embodiments. In other words, the configurations of the side substrate support portion, the lid body side substrate support portion, and the back side substrate support portion are not limited to the configurations of the substrate support plate-like portion 5, the front retainer 7, and the back side substrate support portion 6. Furthermore, the substrate W according to the present embodiment is a silicon wafer having a diameter of 300 mm. However, the present invention is not limited to this value. Furthermore, in the above-mentioned embodiment, the entire face of the lower side inclined face 622 and the entire face of the projecting portion inclined face 6622A are configured from PBT as the second member. However, the present invention is not limited to this configuration. For example, at least a portion of the lower side inclined face and the projecting portion inclined face may be configured from the second member. Furthermore, in the present embodiment, the first member and the second member are integrally formed with each other by insert molding or two color molding, or the attachment member 66A is fixed to the back side end edge support portion 60A. However, the present invention is not limited to these configurations. Furthermore, the lower side abutting face 611 is configured from PC. However, the present invention is not limited thereto. For example, the lower side abutting face 611 may be configured from PBT. Furthermore, the back side substrate support portion is configured from the back side substrate support portion 6 in the present embodiment. However, the present invention is not limited to this configuration. For example, the back side substrate support portion may be configured from a rear retainer that is configured by being integrally molded with the container main body.

EXPLANATION OF REFERENCE NUMERALS

1 substrate storage container
2 container main body
3 lid body
4 substrate support plate-like portion (side substrate support portion)
6 back side substrate support portion
7 front retainer (lid body side substrate support portion)
20 wall portion
21 container main body opening portion
27 substrate storage space
28 opening circumferential portion
611 lower side abutting face
622 lower side inclined face
632 substrate support portion
PBT second member
PC first member
W substrate

The invention claimed is:

1. A substrate storage container comprising:
a container main body that includes a tubular wall portion with an opening circumferential portion at which a container main body opening portion is formed at one end and the other end closed, the container main body having a substrate storage space that can store a plurality of substrates by an inner face of the tubular wall portion, and is in communication with the container main body opening portion;
a lid body that is removably attached to the container main body opening portion and can close the container main body opening portion;
a side substrate support portion that is disposed so as to form a pair in the substrate storage space, and, when the container main body opening portion is not closed by the lid body, can support an edge portion of each of the plurality of substrates in a state in which adjacent substrates among the plurality of substrates are spaced apart at a predetermined interval and arranged in parallel to each other;
a lid body side substrate support portion that is disposed at a portion of the lid body that is a part opposing the substrate storage space when the container main body opening portion is closed by the lid body, and can support the edge portion of each of the plurality of substrates; and
a back side substrate support portion that is disposed so as to form a pair with the lid body side substrate support portion inside the substrate storage space, can support the edge portion of each of the plurality of substrates, and can support the plurality of substrates in cooperation with the lid body side substrate support portion when the container main body opening portion is closed by the lid body,
wherein the back side substrate support portion includes:
a lower side inclined face that extends in an inclined manner so as to be spaced apart from a center of the substrate storage space and on which an end of a back face of the substrate slides; and
a substrate support portion that is located above the lower side inclined face, and abuts and can support the edge portion of the substrate,
wherein, when the container main body opening portion is closed by the lid body, the edge portion of the substrate slides on the lower side inclined face and reaches the substrate support portion,
wherein a part of the lower side inclined face on which the edge portion of the substrate slides, the part being a portion of the lower side inclined face is configured by a second member that is different from a first member that configures the substrate support portion, and the second member has a lower maximum static friction coefficient and lower wear resistance than the first member, and
wherein the edge portion of the substrate slides on the second member and the end edge of the front face of the substrate and the end edge of the back face abut and are supported by the first member, the first member being made from a material different from that of the second member.

2. The substrate storage container according to claim 1, wherein the second member is integrally molded with the first member by insert molding or two color molding.

3. The substrate storage container according to claim 1, wherein the second member is configured from a component that is different from the first member, and is fixed to the first member.

4. The substrate storage container according to claim 1, wherein the first member is configured from polycarbonate resin, and
wherein the second member is configured from polybutylene terephthalate resin.

* * * * *